United States Patent
Park et al.

(10) Patent No.: US 10,269,298 B2
(45) Date of Patent: *Apr. 23, 2019

(54) DISPLAY PANEL

(71) Applicant: Samsung Display Co., Ltd., Yongin (KR)

(72) Inventors: Kee-Bum Park, Cheonan-si (KR); Hyuk-Jin Kim, Asan-si (KR); Byoung Sun Na, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/195,217

(22) Filed: Jun. 28, 2016

(65) Prior Publication Data

US 2016/0307517 A1 Oct. 20, 2016

Related U.S. Application Data

(63) Continuation of application No. 13/851,364, filed on Mar. 27, 2013, now Pat. No. 9,406,266.

(30) Foreign Application Priority Data

May 31, 2012 (KR) .................... 10-2012-0058483

(51) Int. Cl.
*G09G 3/36* (2006.01)
*G09G 3/3275* (2016.01)
(Continued)

(52) U.S. Cl.
CPC .......... *G09G 3/3275* (2013.01); *G09G 3/20* (2013.01); *G09G 3/3266* (2013.01);
(Continued)

(58) Field of Classification Search
CPC ...... G09G 3/3655; G09G 3/3611; G09G 3/20; G09G 3/3266; G09G 3/3674;
(Continued)

(56) References Cited

U.S. PATENT DOCUMENTS 4,773,737 A    9/1988  Yokono et al.
5,396,304 A *  3/1995  Salerno ............. A61B 3/113
                                          257/E27.111
(Continued)

FOREIGN PATENT DOCUMENTS

CN    102436790    5/2012
EP    2503536      9/2012
(Continued)

OTHER PUBLICATIONS

European Search Report—EP Application No. 13163292 dated Oct. 17, 2014.

*Primary Examiner* — Olga V Merkoulova
(74) *Attorney, Agent, or Firm* — Cantor Colburn LLP

(57) ABSTRACT

A display device includes a plurality of pixels disposed in an display area, and a pixel driver connected to at least two of the pixels, wherein the pixel driver drives the at least two pixels, where a portion of the pixel driver is disposed in the display area, and the display device includes the display area, on which an image is displayed, and a non-display area, on which no image is displayed.

14 Claims, 14 Drawing Sheets

(51) Int. Cl.
  *G09G 3/20* (2006.01)
  *G09G 3/3266* (2016.01)
(52) U.S. Cl.
  CPC ......... *G09G 3/3611* (2013.01); *G09G 3/3674* (2013.01); *G09G 3/3688* (2013.01); *G09G 2300/0408* (2013.01); *G09G 2300/0413* (2013.01); *G09G 2300/0426* (2013.01); *G09G 2300/0452* (2013.01); *G09G 2310/0267* (2013.01); *G09G 2310/0281* (2013.01); *G09G 2310/0286* (2013.01); *G09G 2310/0289* (2013.01); *G09G 2310/08* (2013.01); *G09G 2320/0223* (2013.01)
(58) Field of Classification Search
  CPC ... G09G 2300/0413; G09G 2300/0408; G09G 2300/0452; G09G 2310/0267; G09G 2310/0281; G09G 2310/0286; G09G 2320/0223
  USPC ................. 345/690–694, 103, 695–696, 88
  See application file for complete search history.

(56) References Cited

U.S. PATENT DOCUMENTS

| | | | |
|---|---|---|---|
| 5,689,283 A * | 11/1997 | Shirochi | C03B 37/01486 345/213 |
| 6,005,645 A * | 12/1999 | Hirakata | H04N 13/0497 348/E13.029 |
| 6,281,634 B1 * | 8/2001 | Yokoyama | H01L 27/3211 313/506 |
| 6,538,633 B1 | 3/2003 | Ito | |
| 6,989,571 B2 | 1/2006 | Park et al. | |
| 7,710,525 B2 | 5/2010 | Sohn | |
| 7,714,589 B2 | 5/2010 | Jun et al. | |
| 8,228,356 B2 * | 7/2012 | Kwan | G09G 3/20 345/693 |
| 8,462,093 B2 * | 6/2013 | Kato | G09G 3/3614 345/100 |
| 9,501,960 B2 * | 11/2016 | Park | G09G 3/20 |
| 2002/0047560 A1 * | 4/2002 | Lee | H01L 51/0004 315/169.3 |
| 2003/0095135 A1 * | 5/2003 | Kaasila | G06F 3/0481 345/613 |
| 2003/0141807 A1 | 7/2003 | Kawase | |
| 2004/0051685 A1 | 3/2004 | Chung et al. | |
| 2005/0218791 A1 | 10/2005 | Kawase | |
| 2006/0164363 A1 | 7/2006 | Battersby et al. | |
| 2006/0238120 A1 * | 10/2006 | Miller | C09K 11/06 313/506 |
| 2008/0018229 A1 | 1/2008 | Yamazaki | |
| 2008/0084376 A1 | 4/2008 | Hirota et al. | |
| 2008/0246704 A1 | 10/2008 | Kawase | |
| 2009/0121973 A1 | 5/2009 | Kim et al. | |
| 2009/0243972 A1 * | 10/2009 | Her | G09G 5/00 345/55 |
| 2010/0157189 A1 * | 6/2010 | Ma | G02F 1/136286 349/48 |
| 2010/0265224 A1 | 10/2010 | Cok | |
| 2011/0017994 A1 * | 1/2011 | Kuo | G09G 3/3659 257/59 |
| 2011/0043541 A1 | 2/2011 | Cok | |
| 2011/0248968 A1 * | 10/2011 | Suh | G02F 1/13454 345/204 |
| 2011/0254002 A1 | 10/2011 | Ahn et al. | |
| 2011/0285675 A1 | 11/2011 | Amano et al. | |
| 2012/0086682 A1 * | 4/2012 | Shi | G09G 3/3677 345/204 |
| 2012/0127094 A1 * | 5/2012 | Jeong | G06F 3/044 345/173 |
| 2012/0194773 A1 * | 8/2012 | Kim | G02F 1/13336 349/139 |
| 2012/0242637 A1 * | 9/2012 | Yamashita | G09G 3/3607 345/208 |
| 2012/0249603 A1 * | 10/2012 | Ban | G09G 3/3614 345/690 |
| 2013/0057794 A1 * | 3/2013 | Hou | G02F 1/133365 349/43 |
| 2014/0049619 A1 * | 2/2014 | Hsieh | G02F 1/136286 348/51 |

FOREIGN PATENT DOCUMENTS

| | | |
|---|---|---|
| JP | 2002296620 | 10/2002 |
| JP | 2007149640 | 6/2007 |
| JP | 2008040327 | 2/2008 |
| JP | 2008287133 A | 11/2008 |
| JP | 2010002736 | 1/2010 |
| JP | 2010152171 | 7/2010 |
| JP | 2010243857 A | 10/2010 |
| JP | 2012009125 | 1/2012 |
| KR | 1020050000447 A | 1/2005 |
| KR | 1020060087726 A | 8/2006 |
| KR | 100801416 B1 | 1/2008 |
| KR | 100976581 B1 | 8/2010 |
| KR | 1020110001862 A | 1/2011 |
| KR | 101014730 B1 | 2/2011 |

* cited by examiner

DISPLAY PANEL

CROSS REFERENCE TO RELATED APPLICATIONS

This application is a continuation of U.S. patent application Ser. No. 13/851,364, filed on Mar. 27, 2013, which claims priority to Korean Patent Application No. 10-2012-0058483 filed on May 31, 2012 and Korean Patent Application No. 10-2013-0031087 filed on Mar. 22, 2013, and all the benefits accruing therefrom under 35 U.S.C. § 119, the contents of which in the entirety are herein incorporated by reference.

BACKGROUND

(a) Field

Exemplary embodiments of the invention relate to a display panel.

(b) Description of the Related Art

Most widely used types of display panels include a liquid crystal display ("LCD"), an organic light emitting display ("OLED"), a plasma display panel ("PDP") and an electrophoretic display device ("EPD"). The display device generally includes a display panel and a driver that drives the display panel. The display device has become lighter and thinner based on consumer demand.

In the display device, some portions of the driver for driving the display panel are incorporated into the display panel for reducing manufacturing cost. Since the display device does not include a chip for the driver and portions of the driver are incorporated into the display panel when manufacturing the display panel, the manufacturing cost may be reduced. For example, a gate driver to generate scanning signals and/or a data driver to transmit data signals is incorporated into the display panel.

Furthermore, consumer demand for a display with a small bezel, in which the width of the periphery around a viewing area is substantially small, has been increased. When the bezel is increased in area, the display area displaying images may look smaller and manufacturing a tiled display device may be limited.

SUMMARY

An exemplary embodiment of a display device includes a plurality of pixels disposed in an display area, and a pixel driver connected to at least two of the pixels, wherein the pixel driver drives the at least two pixels, where a portion of the pixel driver is disposed in the display area, and the display device includes the display area, on which an image is displayed, and a non-display area, on which no image is displayed.

In an exemplary embodiment, the display device may further include a light blocking member covering the non-display area.

In an exemplary embodiment, the pixel driver may include a first portion disposed in the non-display area, and a second portion connected to the first portion and disposed between the plurality of pixels in the display area.

In an exemplary embodiment, the plurality of pixels may include a plurality of red pixels, a plurality of green pixels, and a plurality of blue pixels, and the second portion of the pixel driver is disposed between adjacent blue pixels of the plurality of blue pixels.

In an exemplary embodiment, each of the plurality of pixels may include: a switching unit connected to the pixel driver, where the switching unit is turned on and off based on a signal from the pixel driver or selectively transmits a signal from the pixel driver, and a display unit connected to the switching unit.

In an exemplary embodiment, the second portion of the pixel driver may include a portion of an active element.

In an exemplary embodiment, the second portion of the pixel driver may include a first thin film transistor, the switching unit of the pixel may include a second thin film transistor, and the first thin film transistor and the second thin film transistor may be disposed in a same layer.

In an exemplary embodiment, the switching unit may include a thin film transistor including a control terminal, an input terminal and an output terminal, and the pixel driver may include a gate driver configured to generate a gate signal applied to the control terminal of the thin film transistor.

In an exemplary embodiment, the gate driver may include a plurality of stages connected to each other, each of the plurality of stages may be connected to a corresponding group of pixels of the plurality of pixels, and each of the plurality of stages may include a first substage disposed in the non-display area, and a second substage connected to the first substage and disposed in the display area.

In an exemplary embodiment, the first substage may include a first transistor, and the second substage may include a second transistor which occupies an area greater than an area which the first transistor occupies.

In an exemplary embodiment, one of the plurality of stages may include an input unit configured to receive a gate signal of a previous stage, a pull up unit configured to output a gate signal thereof; a carry signal generating unit configured to output a carry signal to the previous stage of a subsequent stage; an inverting unit configured to output a signal having a phase reverse to the gate signal thereof; and a pull down unit connected to the input unit, the pull up unit, the carry signal generating unit and the inverting unit, the pull down unit configured to lower a potential of at least a point, where each of the input unit, the pull up unit, the carry signal generating unit, the inverting unit and the pull down unit may include a transistor, and the second substage comprises transistors of the pull down unit, the pull up unit and the carry signal generating unit.

In an exemplary embodiment, the transistors in the second substage may be configured to change the own gate signal from a higher voltage to a lower voltage.

In an exemplary embodiment, a pixel adjacent to the pixel driver may be smaller in size than a pixel which is not adjacent to the pixel driver.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
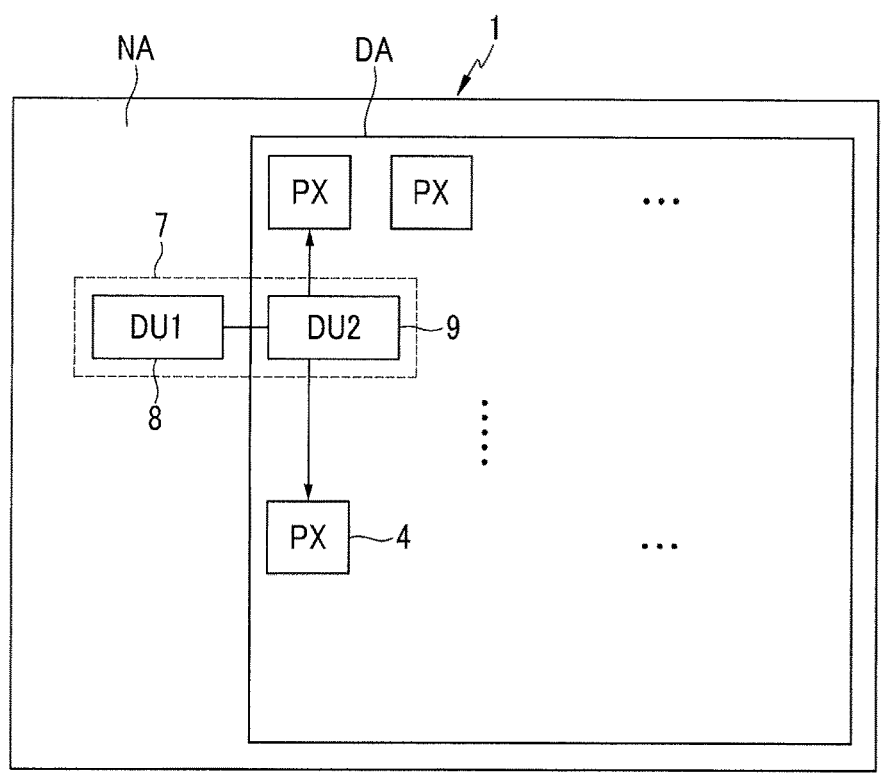
FIG. 1 is a schematic block diagram of a display panel according to an embodiment of the invention.

The invention will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

An exemplary embodiment of a display device according to the invention is described in detail with reference to FIG. 1 to FIG. 4.

Figure 2:
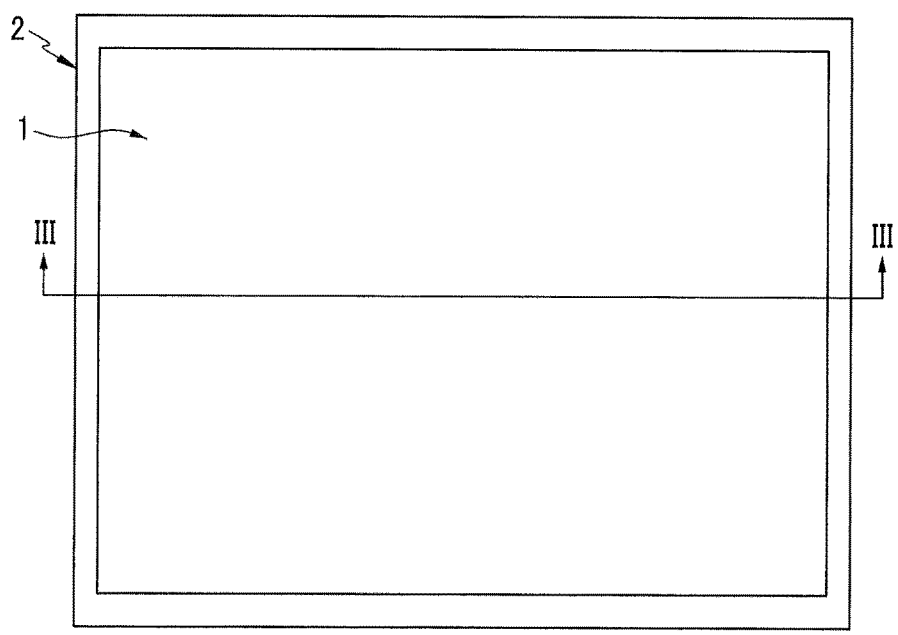
FIG. 2 is a schematic plan view of an exemplary flat panel display including the display panel shown in FIG. 1.
Figure 3A:
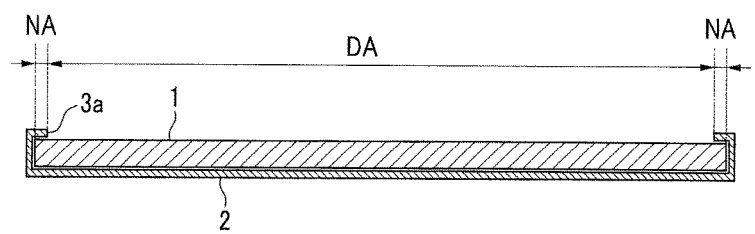
FIGS. 3A and 3B are schematic sectional views taken along line III-III of the display device shown in FIG. 2.
Figure 3B:
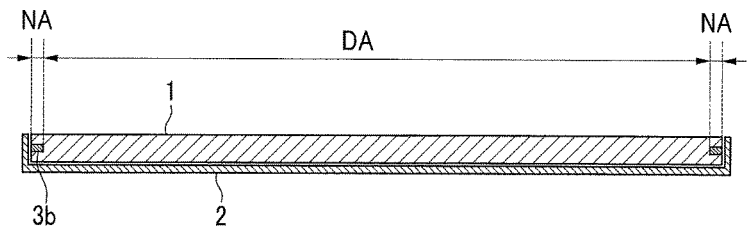
Figure 4:
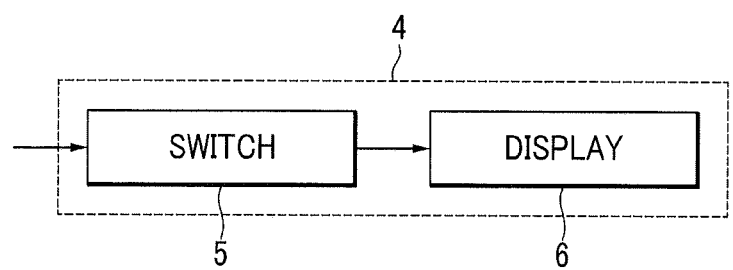
FIG. 4 is a block diagram of a pixel according to an embodiment of the invention.

FIG. 1 is a schematic block diagram of an exemplary embodiment of a display panel according to the invention, FIG. 2 is a schematic plan view of a flat panel display including the display panel shown in FIG. 1, FIG. 3A and FIG. 3B are schematic sectional views taken along line III-III of the display device shown in FIG. 2, and FIG. 4 is a block diagram of an exemplary embodiment of a pixel according to the invention.

Referring to FIG. 1, an exemplary embodiment of a display panel 1 according to the invention includes a plurality of pixels 4 and a pixel driver 7 that drives the pixels 4. The display panel 1 may be a type of a flat panel display ("FPD"), for example, a liquid crystal display ("LCD"), an organic light emitting display ("OLED") or an electrowetting display ("EWD").

Referring to FIG. 1 to FIG. 3B, the display panel 1 is divided into a display area DA and a non-display area NA. The display area DA may include a central portion of the display panel 1, and images are displayed in the display area DA. In an exemplary embodiment, the non-display area NA may be covered with a light blocking member 3a or 3b, for example, as shown in FIG. 2, FIG. 3A, and FIG. 3B. Referring to FIG. 3A, the light blocking member 3a may be a portion of a frame 2 that is disposed external to the display panel 1 and receives the display panel 1. Referring to FIG. 3B, the light blocking member 3b may be disposed in the display panel 1. The non-display area NA may be disposed near peripheries of the display panel 1 surrounding the display area DA, and thus it may be referred to as a peripheral area. In an exemplary embodiment, the display area DA may be substantially rectangular, for example, but not being limited thereto.

According to an alternative exemplary embodiment, the display area DA may be divided into a plurality of subareas, and the non-display area NA may be disposed between the subareas of the display area DA.

In an exemplary embodiment, the pixels 4 are disposed in the display area DA, and may be arranged substantially in a matrix form including rows and columns, for example, but not being limited thereto. Referring to FIG. 4, each of the pixels 4 may include a switching unit 5 electrically connected to the pixel driver 7 and a display unit 6 connected to the switching unit 5. The switching unit 5 may be turned on and off based on a signal from the pixel driver 7 or selectively transmit a signal from the pixel driver 7. The switching unit 5 may include at least one switching element (not shown). The display unit 6 may display an image based on a signal from the switching unit 5.

In an exemplary embodiment, the pixel driver 7 is electrically connected to the pixels 4, and may transmit a signal from an external device to the pixels 4. In an alternative exemplary embodiment, the pixel driver 7 may generate a new signal based on the signal from the external device and apply the newly generated signal to the pixels 4. The pixel driver 7 includes a first portion (DU1) 8 disposed in the non-display area NA and a second portion (DU2) 9 disposed in the display area DA. The first portion 8 and the second portion 9 are electrically connected to each other, and at least one of the first portion 8 and the second portion 9 may be electrically connected to the pixels 4. The second portion 9 may be disposed between the pixels 4.

The pixel driver 7 may include an active element, for example, a transistor or a diode. In an exemplary embodiment, each of the first portion 8 and the second portion 9 may include the active element. In an alternative exemplary embodiment, an active element may be divided into two portions that are included in the first portion 8 and the second portion 9, respectively. In such an embodiment, a first portion of an active element in the pixel driver 7 may be disposed in the display area DA, and a second portion of the active element may be disposed in the non-display area NA. According to another embodiment, the second portion 9 may include a passive element, for example, a capacitor.

In an exemplary embodiment, as shown in FIG. 1, the first portion 8 of the pixel driver 7 is disposed in the non-display area NA at a left side of the display area DA, but the position of the first portion 8 is not limited thereto. In one exemplary embodiment, for example, the first portion 8 of the pixel driver 7 may be disposed in the non-display area NA at a right side, an upper side or a lower side of the display area DA. In an exemplary embodiment, the first portion 8 of the pixel driver 7 may be disposed at any of the left, right, upper or lower side of the display area DA.

In an exemplary embodiment, the pixels 4 and the pixel driver 7 may include a thin film. In one exemplary embodiment, for example, the switching unit 5 of the pixels 4 may include a thin film transistor ("TFT"), and the second portion 9 of the pixel driver 7 may include a TFT. In an exemplary embodiment, the TFT of the pixels 4 and the TFT of the pixel driver 7 may be provided during a same manufacturing process. In one exemplary embodiment, for example, the TFT of the pixels 4 and the TFT of the pixel driver 7 may be provided by patterning the thin film. In one exemplary embodiment, for example, an electrode of the TFT of the pixels 4 and an electrode of the TFT of the pixel driver 7 may be formed from a single conductive layer or a plurality of conductive layers.

According to another alternative exemplary embodiment, at least a portion of the pixel driver 7 may be disposed on a surface of the display panel 1 but not inside the display panel 1.

In an exemplary embodiment, an entire portion of the pixel driver 7 may be disposed in the display area DA. In such an embodiment, there is no first portion 8 of the pixel driver 7 and thus no active element may be disposed in the non-display area NA.

In an exemplary embodiment, the second portion 9 of the pixel driver 7 is moved to the display area DA, a pixel 4 adjacent to the second portion 9 may be smaller in size than other pixels 4, but not being limited thereto. In an alternative exemplary embodiment, the pixels 4 may have substantially the same size as each other.

In an exemplary embodiment, at least a portion of the pixel driver 7 is disposed in the display area DA, and the size of the non-display area NA or the size of the display panel 1 is substantially reduced.

An alternative exemplary embodiment of a display device according to the invention is described in detail with reference to FIG. 5.

Figure 5:
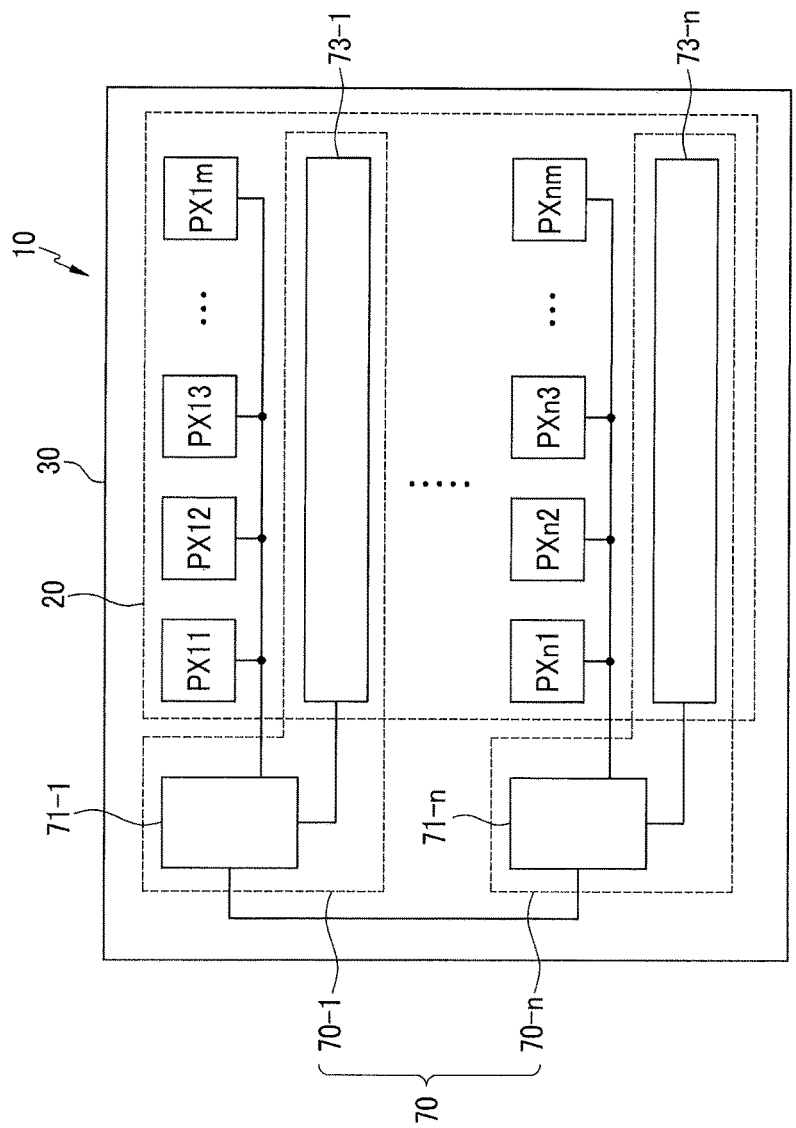
FIG. 5 is a schematic block diagram of a display panel according to another embodiment of the invention.

FIG. 5 is a schematic block diagram of an alternative exemplary embodiment of a display panel according to the invention.

Referring to FIG. 5, an exemplary embodiment of a display panel 10 includes a plurality of pixels PX11, PX12, PX13, . . . , PXnm, which displays images, and a pixel driver 70, which drives the pixels PX11, PX12, PX13, . . . , PXnm. The display panel 10 is divided into a display area 20 and a peripheral area 30. The display area 20 is configured to display images, and the peripheral area 30 does not display images. The peripheral area 30 may be disposed, for example, around the display area 20, and may be covered with a bezel, that is, the part of the top chassis of the display panel surrounding an exposed portion thereof corresponding to the display area 20, for example. The peripheral area 30 may surround at least a portion of the display area 20 or may be disposed near edges of the display panel 10.

The pixels PX11, PX12, PX13, . . . , PXnm are disposed in the display area 20. In an exemplary embodiment, a portion of the pixel driver 70 is disposed in the peripheral area 30, and another portion of the pixel driver 70 is disposed in the display area 20. The pixel driver 70 may generate or transmit electrical signals to be applied to the pixels PX11, PX12, PX13, ..., PXnm, for example, gate signals or data signals. The pixels PX11, PX12, PX13, ..., PXnm may display images or data based on the signals from the pixel driver 70.

The pixels PX11, PX12, PX13, ..., PXnm may be arranged substantially in a matrix form including rows and columns. Referring to FIG. 5, for example, a first row may include m pixels PX11, PX12, PX13, ..., PX1m, and an n-th row may also include m pixels PXn1, PXn2, PXn3, ..., PXnm).

The pixel driver 70 may include a plurality of stages, e.g., first to n-th stages 70-1, ..., 70-n (here, n is a natural number).

Each of the stages 70-1, ..., 70-n may be electrically connected to adjacent stages 70-1, ..., 70-n. In an exemplary embodiment, each of the stages 70-1, ..., 70-n may be connected to the nearest stages 70-1, ..., 70-n. In such an embodiment, each of the stages 70-1, ..., 70-n may be connected to an immediately previous stage or an immediately subsequent stage. In an alternative exemplary embodiment, each of the stages 70-1, ..., 70-n may be electrically connected to the next nearest stages 70-1, ..., 70-n. In one exemplary embodiment, for example, each of the stages 70-1, ..., 70-n may be electrically connected to the next nearest stages 70-1, ..., 70-n, and thus a k-th stage (here, 3<k<(n−2)) may be connected to a (k−2)-th stage and a (k+2)-th stage. However, the connection between the stages 70-1, ..., 70-n may not be limited thereto.

The first stage 70-1 and the last stage 70-n may be connected to each other.

Each of the stages 70-1, ..., 70-n includes the first substages 71-1, ..., 71-n disposed in the peripheral area 30 and the second substages 73-1, ..., 73-n disposed in the display area 20. The first substages 71-1, ..., 71-n and the second substages 73-1, ..., 73-n are electrically connected to each other.

Each of the stages 70-1, ..., 70-n is directly connected to plural pixels PX11, PX12, PX13, ..., PX1m, ..., PXn1, PXn2, PXn3, ..., PXnm.

In an exemplary embodiment, the stages 70-1, ..., 70-n may be arranged in a vertical direction or a column direction. Each of the stages 70-1, ..., 70-n may correspond to a row of pixels PX11, PX12, PX13, ..., PX1m, ..., PXn1, PXn2, PXn3, ..., PXnm, and may be connected to the pixels PX11, PX12, PX13, ..., PX1m, ..., PXn1, PXn2, PXn3, ..., PXnm of a corresponding pixel row. The second substages 73-1, ..., 73-n in each of the stages 70-1, ..., 70-n may extend substantially in a horizontal direction along respective pixel rows, and may be disposed below the respective pixel rows, when viewed from a top view, but the positions of the second substages 73-1, ..., 73-n are not limited thereto. In one exemplary embodiment, for example, at least one of the second substages 73-1, ..., 73-n may be disposed above the respective pixel rows when viewed from a top view.

According to another exemplary embodiment, the stages 70-1, ..., 70-n may be arranged in a horizontal direction or a row direction. Each of the stages 70-1, ..., 70-n may correspond to a column of pixels PX11, ..., PXn1/.../PX1m, ..., PXnm, and may be connected to the pixels PX11, ..., PXn1, ..., PX1m, ..., PXnm of a corresponding pixel column.

In an exemplary embodiment, each of the pixels PX11, PX12, PX13, ..., PXnm may include a switching unit 5 and a display unit 6 as shown in FIG. 4. The switching unit 5 may include a switching element, for example, a TFT. The TFT may include a gate, a source and a drain.

According to an exemplary embodiment, each of the substages 71-1, ..., 71-n, 73-1, ..., 73-n in the pixel driver 70 may include a TFT. The TFT of the pixel driver 70 and the TFT of the pixels PX11, PX12, PX13, ..., PXnm and the may be provided using a same thin film, e.g., formed from the same thin film.

According to an exemplary embodiment of the invention, the pixel driver 70 may be a gate driver that provides gate signals for the gates of the TFTs in the pixels PX11, PX12, PX13, ..., PXnm. According to an alternative exemplary embodiment, the pixel driver 70 may be a data driver that provides data signals for the sources or the drains of the TFTs in the pixels PX11, PX12, PX13, ..., PXnm.

In an exemplary embodiment, the display panel 10 may be a type of a flat panel display, for example, an LCD, an OLED or an EWD.

An exemplary embodiment where the display panel is an LCD according to the invention is described in detail with reference to FIG. 6.

Figure 6:
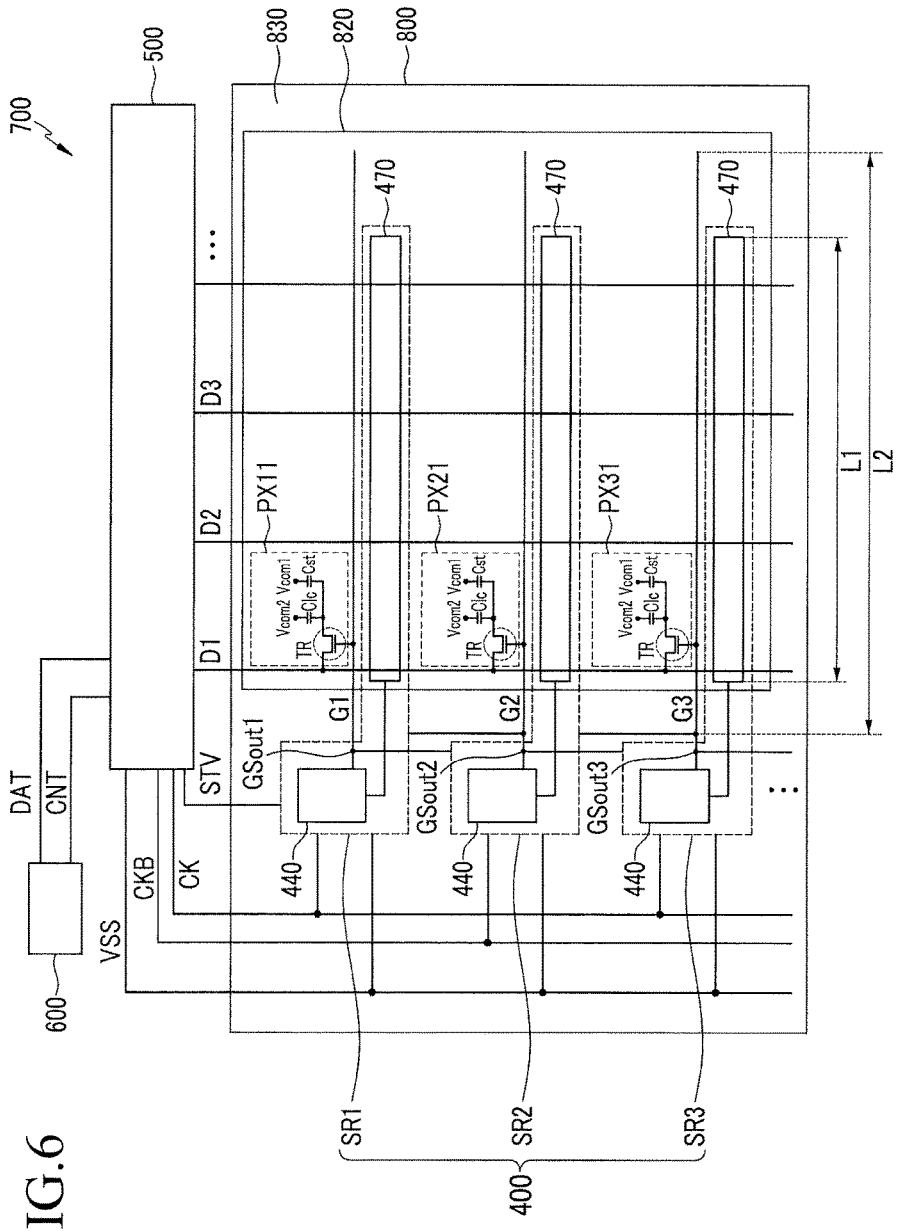
FIG. 6 is a schematic block diagram of an exemplary embodiment of a liquid crystal display ("LCD") according to the invention.

FIG. 6 is a schematic block diagram of an exemplary embodiment of an LCD according to the invention.

Referring to FIG. 6, an exemplary embodiment of an LCD 700 includes a display panel 800, a gate driver 400, a data driver 500 and a signal controller 600. In an exemplary embodiment, the gate driver 400 may be disposed in a portion of the display panel 800.

The display panel 800 may include a plurality of pixels PX11, PX21, PX31, ..., a plurality of gate lines G1, G2, G3, ..., a plurality of data lines D1, D2, D3, ..., and a plurality of input lines VSS, CK, CKB and STV. In such an embedment, the display panel 800 may be divided into a display area 820, on which images are displayed, and a peripheral area 830, on which images are not displayed. The peripheral area 830 may be disposed, for example, around the display area 820, and may be covered with a bezel, for example.

According to an exemplary embodiment of the invention, a portion of the gate driver 400, the pixels PX11, PX21, PX31, ..., the gate lines G1, G2, G3, ..., the data lines D1, D2, D3, ... may be disposed in the display area 820, and other portions of the gate driver 400, the data driver 500, and the input lines VSS, CK, CKB and STV may be disposed in the peripheral area 830 outside the display area 820. The gate lines G1, G2, G3, ... and the data lines D1, D2, D3, ... may extend to the peripheral area 830.

In such an embodiment, a portion of the gate driver 400 is disposed in the display area 820 such that the peripheral area 830 may become substantially narrow, and a width of a bezel of the display panel 800 is thereby substantially reduced.

The pixels PX11, PX21, PX31, ... may be arranged substantially in a matrix form including rows and columns as described with reference to FIG. 5. Each of the pixels PX11, PX21, PX31, ... includes a TFT TR, a liquid crystal ("LC") capacitor Clc and a storage capacitor Cst.

The TFT TR has a control terminal connected to one of the gate lines G1, G2, G3, ..., an input terminal connected to one of the data lines D1, D2, D3, ..., and an output terminal connected to the liquid crystal ("LC") capacitor Clc and the storage capacitor Cst. The storage capacitor Cst may be connected between a first common voltage line Vcom1 and the TFT TR, and the LC capacitor Clc may be connected between a second common voltage line Vcom2 and the TFT TR. In an exemplary embodiment, a voltage level of the first common voltage line Vcom1 and a voltage level of the second common voltage line Vcom2 may be substantially the same as each other. In an alternative exemplary embodiment, the voltage level of the first common voltage line Vcom1 and the voltage level of the second common voltage line Vcom2 may be different from each other. In an exemplary embodiment, the first common voltage line Vcom1 and the second common voltage line Vcom2 may be electrically connected to the signal controller 600 or the data driver 500.

The gate lines G1, G2, G3, . . . may transmit the gate signals outputted from the gate driver 400 to the pixels PX11, PX21, PX31, . . . . The gate lines G1, G2, G3, . . . may extend substantially in the row direction, and may be connected to the pixels PX11, PX21, PX31, . . . of respective pixel rows. The data lines D1, D2, D3, . . . may transmit the data signals outputted from the data driver 500 to the pixels PX11, PX21, PX31, . . . . The data lines D1, D2, D3, . . . may extend substantially in the column direction, and may be connected to the pixels PX11, PX21, PX31, . . . of respective pixel rows. The gate lines G1, G2, G3, . . . and the data lines D1, D2, D3, . . . may be insulated from each other and may cross each other.

The signal controller 600 outputs a plurality of signals, for example, image signals DAT and control signals CNT. The control signals CNT may include at least one low voltage VSS, clock signals CK and CKB, and a scanning start signal STV, for example. Hereinafter, reference characters VSS, CK, CKB and STV that denote the input lines may be also used to denote signals or voltages carried by the input lines.

The data driver 500 may generate data signals based on the signals from the signal controller 600, for example, the image signals DAT or the control signals CNT. The signals DAT, CNT from the signal controller 600 to the data driver 500 may be transmitted via conductive lines on films such as flexible printed circuit films, and the data driver 500 may transmit the signals STV, CK, CKB and VSS to the gate driver 400 via conductive lines on films such as flexible printed circuit films.

The gate driver 400 receives the at least one low voltage VSS, the clock signals CK and CKB, and the scanning start signal STV from the data driver 500, and generates the gate signals including a gate-on voltage and a gate-off voltage, for example, to be applied to the gate lines G1, G2, G3, . . . . The gate-on voltage may turn on the TFT TR, and the gate-off voltage may turn off the TFT TR.

The gate driver 400 includes a plurality of stages SR1, SR2, SR3, . . . connected to each other. The stages SR1, SR2, SR3, . . . may be arranged in a direction, for example, in a vertical direction. Each of the stages SR1, SR2, SR3, . . . may generate a gate signal and applies the gate signal to a corresponding gate line G1, G2, G3, . . . . Each of the stages SR1, SR2, SR3, . . . includes a gate signal output terminal GSout1, GSout2, GSout3, . . . that is connected to the corresponding gate line G1, G2, G3, . . . , and outputs the gate signal.

According to an exemplary embodiment of the invention, each of the stages SR1, SR2, SR3, . . . may be connected to gate signal output terminals GSout1, GSout2, GSout3, . . . of a previous stage of the stages SR1, SR2, SR3, . . . and a subsequent stage of the stages SR1, SR2, SR3, . . . . The first stage SR1 that has no previous stage may be supplied with the scanning start signal STV which informs a start of a frame, instead of being connected to a previous stage. The last stage that has no subsequent stage may be supplied with another signal instead of being connected to a following stage.

According to an exemplary embodiment of the invention, each of the stages SR1, SR2, SR3, . . . receives a low voltage VSS corresponding to the gate-off voltage. Each of the stages SR1, SR2, SR3, . . . may receive another low voltage lower than the gate-off voltage.

Each of the stages SR1, SR2, SR3, . . . receives one of the clock signals CK and CKB. The clock signals include first and second clock signals CK and CKB, and the first clock signal CK may be supplied to odd-numbered stages SR1, SR3, . . . , while the second clock signal CKB may be supplied to even-numbered stages SR2, . . . . The phase of the second clock signal CKB may be reverse to the phase of the first clock signal CK.

The gate driver 400 may further include one or more dummy stages (not shown) that are not connected to the gate lines G1, G2, G3, . . . . The dummy stage may receive one of the clock signals CK and CKB, the low voltage VSS, and a gate signal of the last stage and generate a dummy gate signal, and the dummy gate signal may be inputted into the last stage. The display panel 800 may further include a dummy gate line (not shown) connected to the dummy gate stage. The dummy stage and the dummy gate line may be disposed in the peripheral area 830.

According to an exemplary embodiment of the invention, each of the stages SR1, SR2, SR3, . . . includes a first substage 440 and a second substage 470. The second substages 470 are disposed in the display area 820, and the first substages 440 are disposed in the peripheral area 830. The first substage 440 and the second substage 470 are electrically connected to each other. The first substages 440 are connected to respective gate lines G1, G2, G3, . . . , and apply the gate signals to the respective gate lines G1, G2, G3, . . . .

The second substages 470 may extend substantially in the horizontal direction along the corresponding gate lines G1, G2, G3, . . . . According to an exemplary embodiment, a second substage 470 has a length L1 in a range from about 5% to about 20% of the length L2 of a gate line G1, G2, G3, . . . . The length L1 of the second substages 470 may be determined based on the resistance and the capacitance of the gate lines G1, G2, G3, . . . , the magnitude of the gate signals, and/or the size of the display panel 800 or the pixels PX11, PX21, PX31, . . . .

According to an alternative exemplary embodiment of the invention, the stages SR1, SR2, SR3, . . . of the gate driver 400 may be divided into two portions disposed in a left side and a right side of the display panel 800, respectively. In one exemplary embodiment, for example, the odd-numbered stages SR1, SR3, . . . connected to odd-numbered gate lines G1, G3, . . . may be substantially in a left area of the display panel 800, and the even-numbered stages SR2, . . . connected to even-numbered gate lines G2, . . . may be substantially in a right area of the display panel 800. In such an embodiment, the first substages 440 of the odd-numbered stages SR1, SR3, . . . may be disposed in a left portion of the peripheral area 830, which is disposed near a left edge of the display area 820, and the first substages 440 of the even-numbered stages SR2, . . . may be disposed in a right portion of the peripheral area 830, which is disposed near a right edge of the display area 820. In an alternative exemplary embodiment, the odd-numbered stages SR1, SR3, . . . may be substantially in the right area of the display panel 800, and the even-numbered stages SR2, . . . may be substantially in the left area of the display panel 800.

According to an exemplary embodiment, each of the stages SR1, SR2, SR3, ... in the gate driver 400 may include a TFT. The TFT of the gate driver 400 may be provided in the same process as TFT TR of the pixels PX11, PX21, PX31, ..., e.g., formed by substantially the same process as the TFT TR of the pixels PX11, PX21, PX31, ....

According to an exemplary embodiment, a first portion of the TFT in the gate driver 400 may be included in a first substage 440, and a second portion may be included in a second substage 470. According to an alternative exemplary embodiment, each of the stages SR1, SR2, SR3, ... may include a plurality of TFTs, and each of the first substage 440 and the second substage 470 may include one or more TFTs. The TFT included in the second substage 470 may occupy an area greater than an area occupied by another TFT such that the area of the peripheral area 830 is substantially reduced.

In an exemplary embodiment, as shown in FIG. 6, the gate driver 400 is included in an LCD, but not being limited thereto. In an alternative exemplary embodiment, the gate driver 400 may be used in an OLED, an EWD or other display devices.

Next, an exemplary embodiment of a stage of the gate driver shown in FIG. 6 will be described in greater detail with reference to FIG. 7 as well as FIG. 6.

Figure 7:
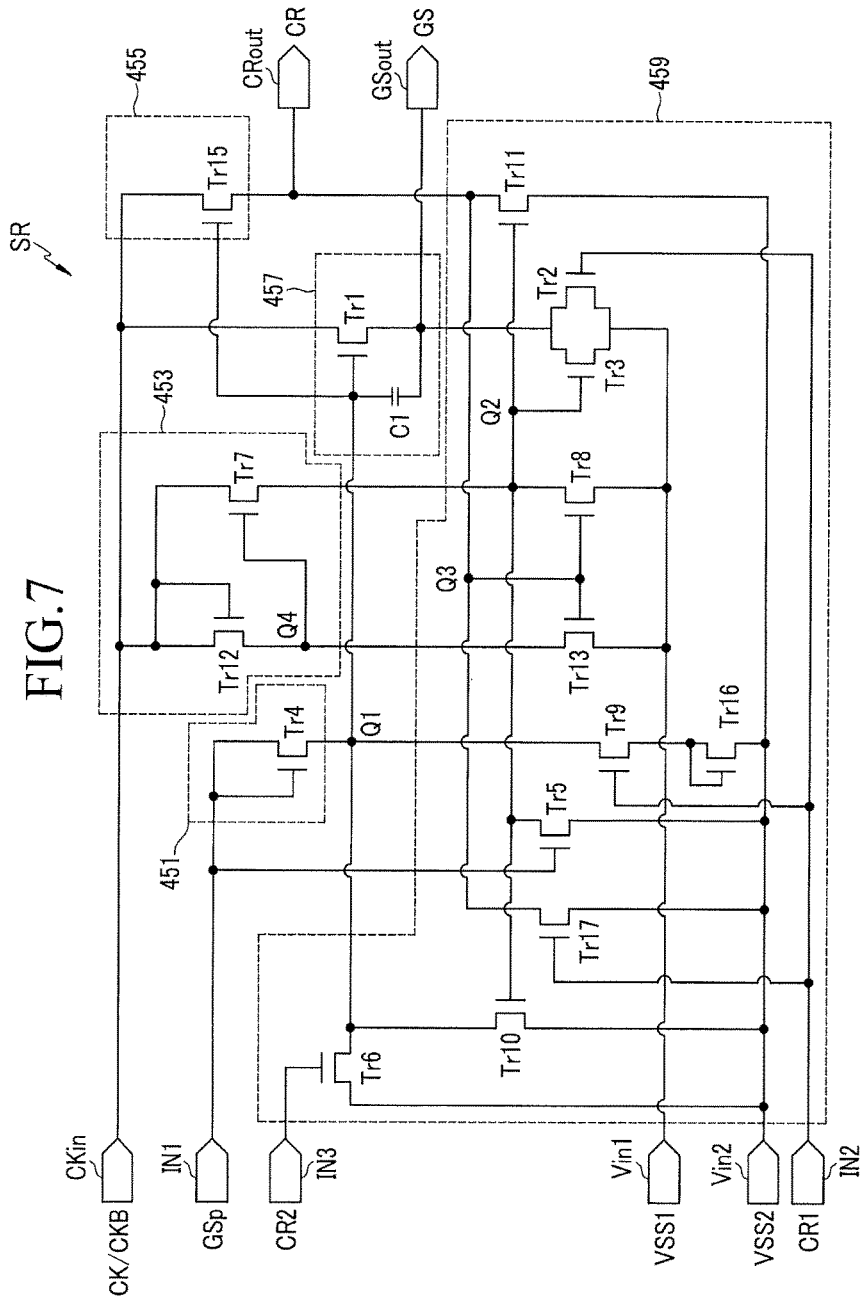
FIG. 7 is a circuit diagram of an exemplary embodiment of a stage in the gate driver shown in FIG. 6.

FIG. 7 is a circuit diagram of an exemplary embodiment of a stage in the gate driver shown in FIG. 6.

Referring to FIG. 7, a stage SR of the gate driver generates and outputs a carry signal CR and a gate signal GS. The stage SR includes a clock terminal CKin, first to third signal input terminals IN1, IN2 and IN3, first and second low voltage input terminals Vin1 and Vin2, a gate signal output terminal GSout, a carry signal output terminal CRout, and a plurality of TFTs, for example, first to seventeenth TFTs Tr1, ..., Tr17.

Referring to FIG. 6 and FIG. 7, the clock terminal CKin receives one of first and second clock signals CK and CKB, which are different from each other. In one exemplary embodiment, for example, referring to FIG. 6, an odd-numbered stage SR1, SR3, ... may be supplied with the first clock signal CK, and an even-numbered stage SR2, ... may be supplied with the second clock signal CKB.

The first signal input terminal IN1 may receive a gate signal GSp of a previous stage. The first signal input terminal IN1 of a first stage that has no previous stage may be supplied with a scanning start signal STV.

The second signal input terminal IN2 may receive a carry signal of a subsequent stage, e.g., a carry signal CR1 of an immediately subsequent stage.

The third signal input terminal IN3 may receive a carry signal of another subsequent stage, e.g., a carry signal CR2 of a subsequent stage after the immediately subsequent stage.

The first low voltage input terminal Vin1 and the second low voltage input terminal Vin2 may receive a first low voltage VSS1 and a second low voltage VSS2, respectively, which have different voltage levels. In an exemplary embodiment, the second low voltage VSS2 may be lower than the first low voltage VSS1. The voltage levels of the first low voltage VSS1 and the second low voltage VSS2 may vary based on a circumstance, and may be lower than about −5 volts (V), for example.

The TFTs Tr1, ..., Tr17 may be included in an input unit 451, an inverting unit 453, a carry signal generating unit 455, the pull up unit 457, and the pull down unit 459 of the stage SR.

The input unit 451 is connected to the first signal input terminal IN1 and receives the gate signal GSp of the previous stage (or the scanning start signal STV when the stage SR is a first stage). When the gate signal GSp of the previous stage becomes a gate-on voltage, the input unit 451 connects an output terminal thereof to an input terminal thereof, thereby outputting the gate-on voltage as it is. When the gate signal GSp of the previous stage becomes a gate-off voltage, the input unit 451 disconnects the output terminal thereof from the input terminal thereof. In an exemplary embodiment of the invention, the input unit 451 includes the fourth TFT Tr4. The fourth TFT Tr4 has an input terminal and a control terminal commonly connected (or diode-connected) to the first signal input terminal IN1, and an output terminal connected to a first node Q1.

In an exemplary embodiment, the inverting unit 453 is connected to the clock terminal CKin and second and fourth nodes Q2 and Q4, and outputs a signal having a phase opposite to the gate signal GS. In such an embodiment, a signal phase at the second node Q2 connected to an output of the inverting unit 453 is opposite to a signal phase at a third node Q3 connected to the gate signal output terminal GSout. An output signal of the inverting unit 453 or a signal at the second node Q2 may be referred to as an inverter signal. According to an exemplary embodiment of the invention, the inverting unit 453 may include the seventh TFT Tr7 and the twelfth TFT Tr12. The twelfth TFT Tr12 has a control terminal and an input terminal commonly connected to the clock terminal CKin, and an output terminal connected to the fourth node Q4. The seventh TFT Tr7 has a control terminal connected to the fourth node Q4, an input terminal connected to the clock terminal CKin, and an output terminal connected to the second node Q2. Parasitic capacitors may be formed between the input terminal and the control terminal of the seventh TFT Tr7 and between the control terminal and the output terminal of the seventh TFT Tr7. When an input CK/CKB from the clock terminal CKin is in a high level, the twelfth TFT Tr12 and the seventh TFT Tr7 are turned on such that the voltage of the second node Q2 becomes high. When the input CK/CKB from the clock terminal CKin is in a low level, the twelfth TFT Tr12 is turned off, and the seventh TFT Tr7 operates based on the voltage of the fourth node Q4. When the voltage of the fourth node Q4 is high, the seventh TFT Tr7 is turned on and thereby transmits a low voltage to the second node Q2, and the seventh TFT Tr7 is turned off when the voltage of the fourth node Q4 is low.

The carry signal generating unit 455 is connected to the clock terminal CKin, the first node Q1 and the carry signal output terminal CRout, and outputs the carry signal CR through the carry signal output terminal CRout. According to an exemplary embodiment, the carry signal generating unit 455 may include the fifteenth TFT Tr15. The fifteenth TFT Tr15 has an input terminal connected to the clock terminal CKin, a control terminal connected to the first node Q1, and an output terminal connected to the carry signal output terminal CRout and the third node Q3. When the voltage of the first node Q1 is high, the input CK/CKB from the clock terminal CKin is outputted through the carry signal output terminal CRout. When the voltage of the first node Q1 is low, the voltage of the third node Q3 is outputted through the carry signal output terminal CRout. A parasitic capacitor (not shown) may be formed between the control terminal and the output terminal of the fifteenth TFT Tr15.

The pull up unit 457 is connected to the clock terminal CKin, the first node Q1 and the gate signal output terminal GSout, and outputs the gate signal GS through the gate signal output terminal GSout. According to an exemplary embodiment, the pull up unit 457 may include the first TFT Tr1 and a capacitor C1. The first TFT Tr1 has a control terminal connected to the first node Q1, an input terminal connected to the clock terminal CKin, and an output terminal connected to the gate signal output terminal GSout. The capacitor C1 is connected between the control terminal and the output terminal of the first TFT Tr1. When the voltage of the first node Q1 is high, the input CK/CKB from the clock terminal CKin is outputted through the gate signal output terminal GSout. When the voltage of the first node Q1 is lowered, the first TFT Tr1 is turned off and a low voltage from another unit is outputted through the gate signal output terminal GSout.

The pull down unit 459 lowers the potential of the first and second nodes Q1 and Q2, the carry signal CR, or the gate signal GS, to effectively stable the gate signal GS and the carry signal CR. The pull down unit 459 may include the second TFT Tr2, the third TFT Tr3, the fifth TFT Tr5, the sixth TFT Tr6, the eighth TFT Tr8 to the eleventh TFT Tr11, the thirteenth TFT Tr13, the sixteenth TFT Tr16 and the seventeenth TFT Tr17.

A circuit that pulls down the first node Q1, which may include the sixth TFT Tr6, the ninth TFT Tr9, the tenth TFT Tr10 and the sixteenth TFT Tr16, will be described.

The sixth TFT Tr6 may be turned on based on the carry signal CR2 of the subsequent stage after the immediately subsequent stage to lower the voltage of the first node Q1 to the second low voltage VSS2. The sixth TFT Tr6 has a control terminal connected to the third signal input terminal IN3, an input terminal connected to the second low voltage input terminal Vin2, and an output terminal connected to the node Q1.

The ninth TFT Tr9 and the sixteenth TFT Tr16 are turned on based on the carry signal CR1 of the immediately subsequent stage to pull down the voltage of the first node Q1 to the second low voltage VSS2, for example. The ninth TFT Tr9 has a control terminal connected to the second signal input terminal IN2, a first input/output terminal connected to the node Q1, and a second input/output terminal connected to the sixteenth TFT Tr16. The sixteenth TFT Tr16 has a control terminal and an output terminal commonly connected to the second input/output terminal of the ninth TFT Tr9, and an input terminal connected to the second low voltage input terminal Vin2.

The tenth TFT Tr10 lowers the voltage of the first node Q1 to the second low voltage VSS2 when the voltage of the second node Q2 is high. The tenth TFT Tr10 has a control terminal connected to the second node Q2, an input terminal connected to the second low voltage input terminal Vin2, and output terminal connected to the first node Q1.

A circuit that pulls down the second node Q2, which may include the fifth TFT Tr5, the eighth TFT Tr8 and the thirteenth TFT Tr13, will be described.

The fifth TFT Tr5 lowers the voltage of the second node Q2 to the second low voltage VSS2 based on the gate signal GSp of the previous stage. The fifth TFT Tr5 has a control terminal connected to the first signal input terminal IN1, an input terminal connected to the second low voltage input terminal Vin2, and an output terminal connected to the second node Q2.

The eighth TFT Tr8 and the thirteenth TFT Tr13 lower the voltage of the second node Q2 to the first low voltage VSS1 based on the voltage of the third node Q3 or the carry signal CR. The eighth TFT Tr8 has a control terminal connected to the carry signal output terminal CRout or the third node Q3, an input terminal connected to the first low voltage input terminal Vin1, and an output terminal connected to the second node Q2. The thirteenth TFT Tr13 has a control terminal connected to the carry signal output terminal CRout or the third node Q3, an input terminal connected to the first low voltage input terminal Vin1, and an output terminal connected to the fourth node Q4. The thirteenth TFT Tr13 lowers the voltage of the fourth node Q4 to the first low voltage VSS1 and turns off the seventh TFT Tr7 based on the voltage of the third node Q3 or the carry signal CR. In such an embodiment, the clock signal CK/CKB is blocked from being applied to the second node Q2 such that the voltage of the second node Q2 is maintained as the first low voltage VSS1 from the eighth TFT Tr8.

A circuit that pulls down the voltage of the carry signal CR, which may include the eleventh TFT Tr11 and the seventeenth TFT Tr17, will be described.

The eleventh TFT Tr11 pulls down the carry signal CR to the second low voltage VSS2 when the voltage of the second node Q2 is high. The eleventh TFT Tr11 has a control terminal connected to the second node Q2, an input terminal connected to the second low voltage input terminal Vin2, and an output terminal connected to the carry signal output terminal CRout.

The seventeenth TFT Tr17 lowers the voltage of the carry signal output terminal CRout to the second low voltage VSS2 based on the carry signal CR1 of the immediately subsequent stage. The seventeenth TFT Tr17 assists the operation of the eleventh TFT Tr11. The seventeenth TFT Tr17 has a control terminal connected to the second signal input terminal IN2, an input terminal connected to the second low voltage input terminal Vin2, and an output terminal connected to the carry signal output terminal CRout.

A circuit that stabilizes the voltage of the gate signal GS, which may include the second TFT Tr2 and the third TFT Tr3, will be described.

The second TFT Tr2 changes the gate signal GS to the first low voltage VSS1 based on the carry signal CR1 of the immediately subsequent stage. The second TFT Tr2 has a control terminal connected to the second signal input terminal IN2, an input terminal connected to the first low voltage input terminal Vin1, and an output terminal connected to the gate signal output terminal GSout. According to another exemplary embodiment of the invention, the input terminal of the second TFT Tr2 may be connected to the second low voltage input terminal Vin2.

The third TFT Tr3 changes the gate signal GS to the first low voltage VSS1 when the voltage of the second node Q2 is high. The third TFT Tr3 has a control terminal connected to the second node Q2, an input terminal connected to the first low voltage input terminal Vin1, and an output terminal connected to the gate signal output terminal GSout.

In an exemplary embodiment of the stage SR, the first TFT Tr1 in the pull up unit 457 or the second TFT Tr2 in the pull down unit 459 may occupy about 50% or more of the entire area of the stage SR to generate or apply the gate signal GS. In such an embodiment, at least one of the first TFT Tr1 and the second TFT Tr2 is disposed in the display area 820, and the size of the peripheral area 830 or the size of a bezel is thereby substantially reduced.

The stage SR shown in FIG. 7 may be used not only in an LCD but also in other types of display device such as an OLED and an EWD, for example.

Now, an exemplary embodiment of a display panel of an LCD where the second TFT Tr2 is disposed in the display area 830 will be described in detail with reference to FIG. 8.

Figure 8:
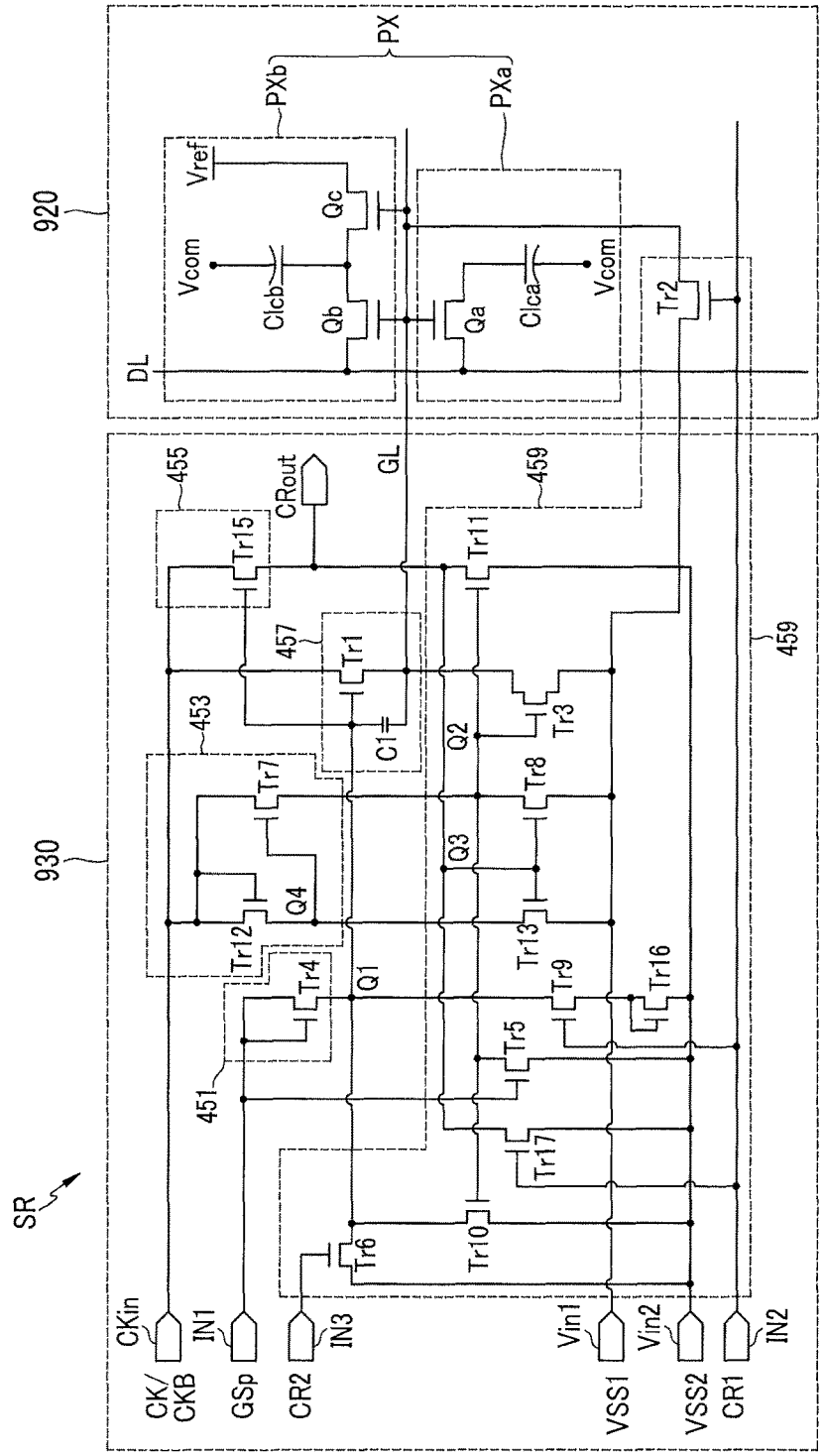
FIG. 8 is a circuit diagram of a gate driver and a pixel in an exemplary embodiment of a display panel of an LCD according to the invention.

FIG. 8 is a circuit diagram of a gate driver and a pixel in an exemplary embodiment of a display panel of an LCD according to the invention.

Referring to FIG. 8, an exemplary embodiment of a display panel includes a gate driver including a stage SR, a pixel PX, a gate line GL, and a data line DL, and the display panel is divided into a the display area 920 and a peripheral area 930.

The gate line GL transmits a gate signal, and the data line DL transmits a data signal.

The pixel PX includes a first switching element Qa, a second switching element Qb, a third switching element Qc, a first LC capacitor Clca, and a second LC capacitor Clcb. The first to third switching elements Qa, Qb and Qc may be three-terminal devices such as TFTs. Each of the first switching element Qa and the second switching element Qb has a control terminal connected to the gate line GL and an input terminal connected to the data line DL, and output terminals of the first switching element Qa and the second switching element Qb are connected to the first LC capacitor Clca and the second LC capacitor Clcb, respectively. The third switching element Qc has a control terminal connected to the gate line GL, an input terminal connected to a reference voltage Vref, and an output terminal connected to the second LC capacitor Clcb. The first LC capacitor Clca may be connected between the first switching element Qa and a common voltage Vcom. The second LC capacitor Clcb has a first terminal connected to the second and third switching elements Qb and Qc, and a second terminal connected to the common voltage Vcom.

The stage SR of FIG. 8 has as structure substantially the same as the structure of the stage shown in FIG. 7. In such an embodiment, the stage SR includes a clock terminal CKin, first to third signal input terminals IN1, IN2 and IN3, first and second low voltage input terminals Vin1 and Vin2, a gate signal output terminal GSout, a carry signal output terminal CRout, and first to seventeenth TFTs Tr1, ..., Tr17. In FIG. 8, a point corresponding to the gate signal output terminal GSout is shown to be directly connected to the gate line GL.

In an exemplary embodiment, the second TFT Tr2 is disposed in the display area 920, and the other TFTs Tr1, Tr3, ..., Tr17 are disposed in the peripheral area 930. According to an exemplary embodiment of the invention, the second TFT Tr2 may be disposed below the pixel PX. The second TFT Tr2 may have a channel width-to-length ratio may be greater than a channel width-to-length ratio of the first to third switching elements Qa, Qb and Qc.

When the gate signal applied to the gate line GL connected to the stage SR becomes a gate-on voltage, the first to third switching elements Qa, Qb and Qc connected to the gate line GL are turned on. When the first to third switching elements Qa, Qb and Qc connected to the gate line GL are turned on, the data voltage applied to the data line DL is applied to the first LC capacitor Clca and the second LC capacitor Clcb via the first switching element Qa and the second switching element Qb, respectively. In such an embodiment, the voltage of the output terminal of the first switching element Qa may be substantially the same as the data voltage, while the voltage of the output terminal of the second switching element Qb may be different from the data voltage. In such an embodiment, the second and third switching elements Qb and Qc that are connected in series between the data voltage and the reference voltage Vref may serve as electrical resistance to divide the data voltage. Accordingly, the voltage applied to the second LC capacitor Clcb may be less than the voltage applied to the first LC capacitor Clca such that the voltage across the first LC capacitor Clca and the voltage across the second LC capacitor Clcb are different from each other. The difference in the voltage between the first LC capacitor Clca and the second LC capacitor Clcb may generate different tilt angles of liquid crystal molecules between a first subpixel PXa corresponding to the first LC capacitor Clca and a second subpixel PXb corresponding to the second LC capacitor Clcb, thereby differentiating the luminance of the two subpixels. In such an embodiment of an LCD having subpixels with different luminance, lateral visibility is substantially improved.

An exemplary embodiment of the stage SR connected to two or more gate lines will be described in detail with reference to FIG. 9 and FIG. 10.

Figure 9:
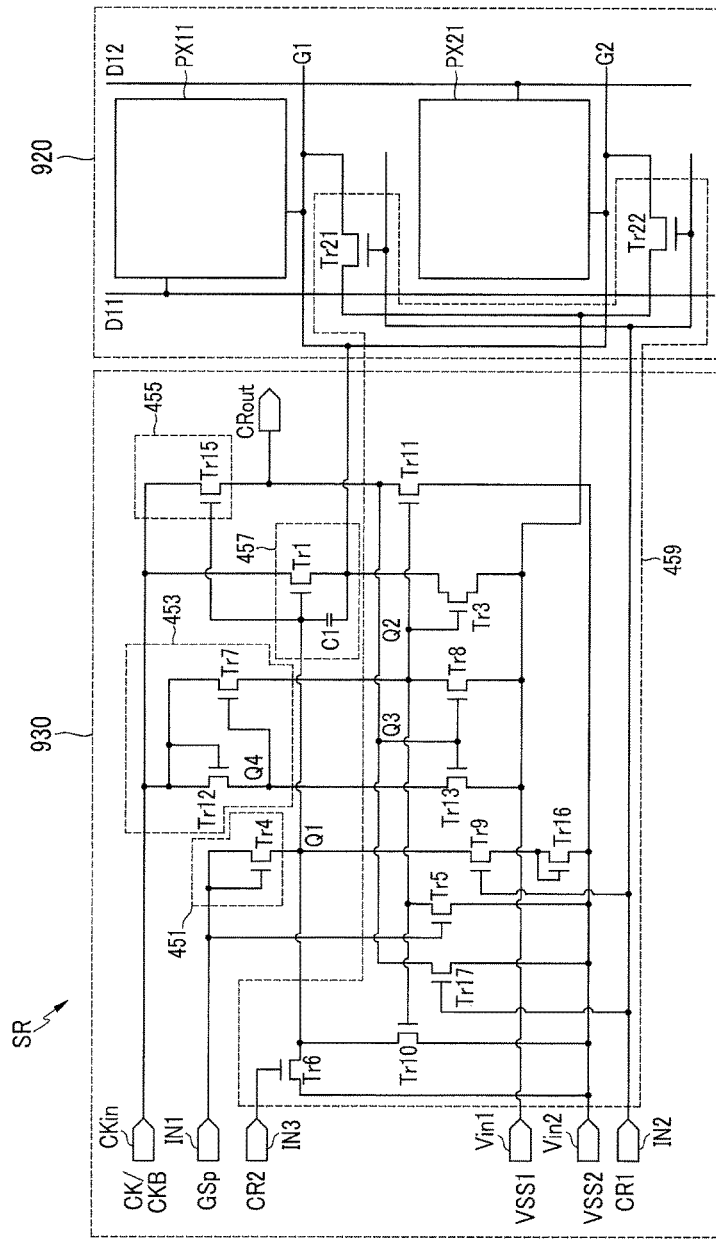
FIG. 9 is a circuit diagram of a gate driver and a pixel in an exemplary embodiment of a display panel according to the invention.
Figure 10:
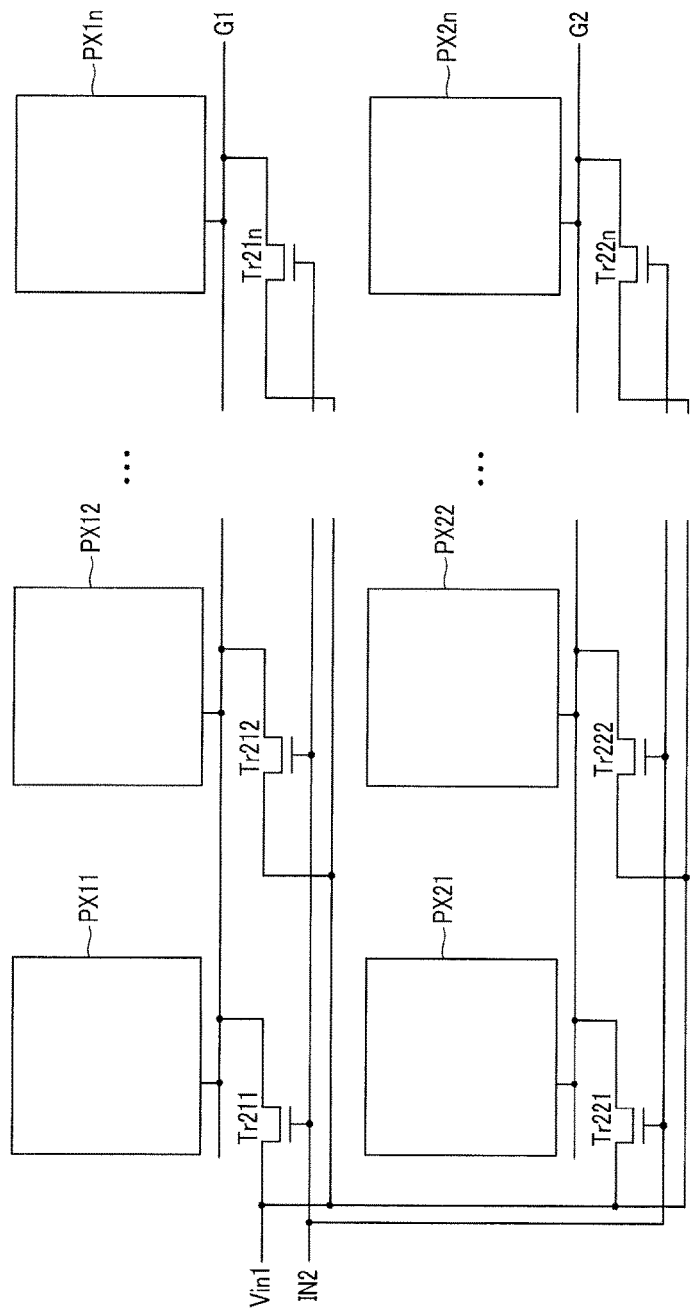
FIG. 10 is an equivalent circuit diagram of a display area in an alternative exemplary embodiment of a display panel according to the invention.

FIG. 9 is a circuit diagram of a gate driver and a pixel in an exemplary embodiment of a display panel according to the invention, and FIG. 10 is an equivalent circuit diagram of a display area in an alternative exemplary embodiment of a display panel according to the invention.

Referring to FIG. 9, an exemplary embodiment of a display panel includes a gate driver including a stage SR, pixels, e.g., a first pixel PX11 and a second pixel PX21, gate lines, e.g., a first gate line G1 and a second gate line G2, and data lines, e.g., a first data line D11 and a second data line D12, and is divided into a the display area 920 and a peripheral area 930.

The stage SR shown in FIG. 9 is substantially the same as the stage SR shown in FIG. 8 except the second TFT Tr2. In such an embodiment, the stage SR includes a clock terminal CKin, first to third signal input terminals IN1, IN2 and IN3, first and second low voltage input terminals Vin1 and Vin2, a gate signal output terminal GSout, a carry signal output terminal CRout, and first to seventeenth TFTs Tr1, ..., Tr17.

In an exemplary embodiment, as shown in FIG. 9, the stage SR is connected to two gate lines, e.g., a first gate line G1 and a second gate line G2, and includes a plurality of second TFTs, e.g., first second TFT Tr21 and a second second TFT Tr22. In such an embodiment, as shown in FIG. 9, the stage SR may have a vertical length corresponding to the vertical length of two pixel columns.

The first and second data lines D11 and D12 are disposed at a left side and a right side of a column of pixels PX11 and PX12, respectively, and the two pixels PX11 and PX12 are connected to different data lines D11 and D12.

In an exemplary embodiment, the second TFTs Tr21 and Tr22 are disposed in the display area 920, and the other TFTs Tr1, Tr3, ..., Tr17 are disposed in the peripheral area 930. Each of the second TFTs Tr21 and Tr22 may be disposed near a corresponding gate line G1 or G2 and between two adjacent pixels PX11 and PX21 in a column direction, for example, under the first pixel PX11 or the second pixel PX21.

In an alternative exemplary embodiment, the stage SR may include three or more the second TFTs. In one exemplary embodiment, referring to FIG. 10, for example, the number of the second TFTs Tr211, Tr212, ..., Tr21n, Tr221, Tr222, ..., Tr22n in the stage SR may be equal to the number of pixels PX11, PX12, ..., PX1n, PX21, PX22, ..., PX2n in a corresponding pixel rows. In such an embodiment, each of the second TFTs Tr211, Tr212, ..., Tr21n, Tr221, Tr222, ..., Tr22n may be disposed on/under a corresponding pixel of the pixels PX11, PX12, .... PX1n, PX21, PX22, ..., PX2n.

In another alternative exemplary embodiment, the number of the second TFTs in the stage SR may be less than the number of pixels PX11, PX12, ..., PX1n, PX21, PX22, ..., PX2n in a corresponding pixel rows. In such an embodiment, second TFTs are disposed on/under some of the pixels PX11, PX12, . . . , PX1n, PX21, PX22, . . . , PX2n while no second TFT is disposed on/under the other of the pixels PX11, PX12, . . . , PX1n, PX21, PX22, . . . , PX2n. In such an embodiment, some of the pixels PX11, PX12, . . . , PX1n, PX21, PX22, . . . , PX2n disposed on the second TFTs may be smaller in size than the other of the pixels PX11, PX12, . . . , PX1n, PX21, PX22, . . . , PX2n. In another exemplary embodiment, all pixels PX11, PX12, . . . , PX1n, PX21, PX22, . . . , PX2n may have substantially the same size.

Next, an exemplary embodiment of a display panel assembly of an LCD having the stage shown in FIG. 9 and/or FIG. 10 will be described with reference to FIG. 11 to FIG. 13.

Figure 11:
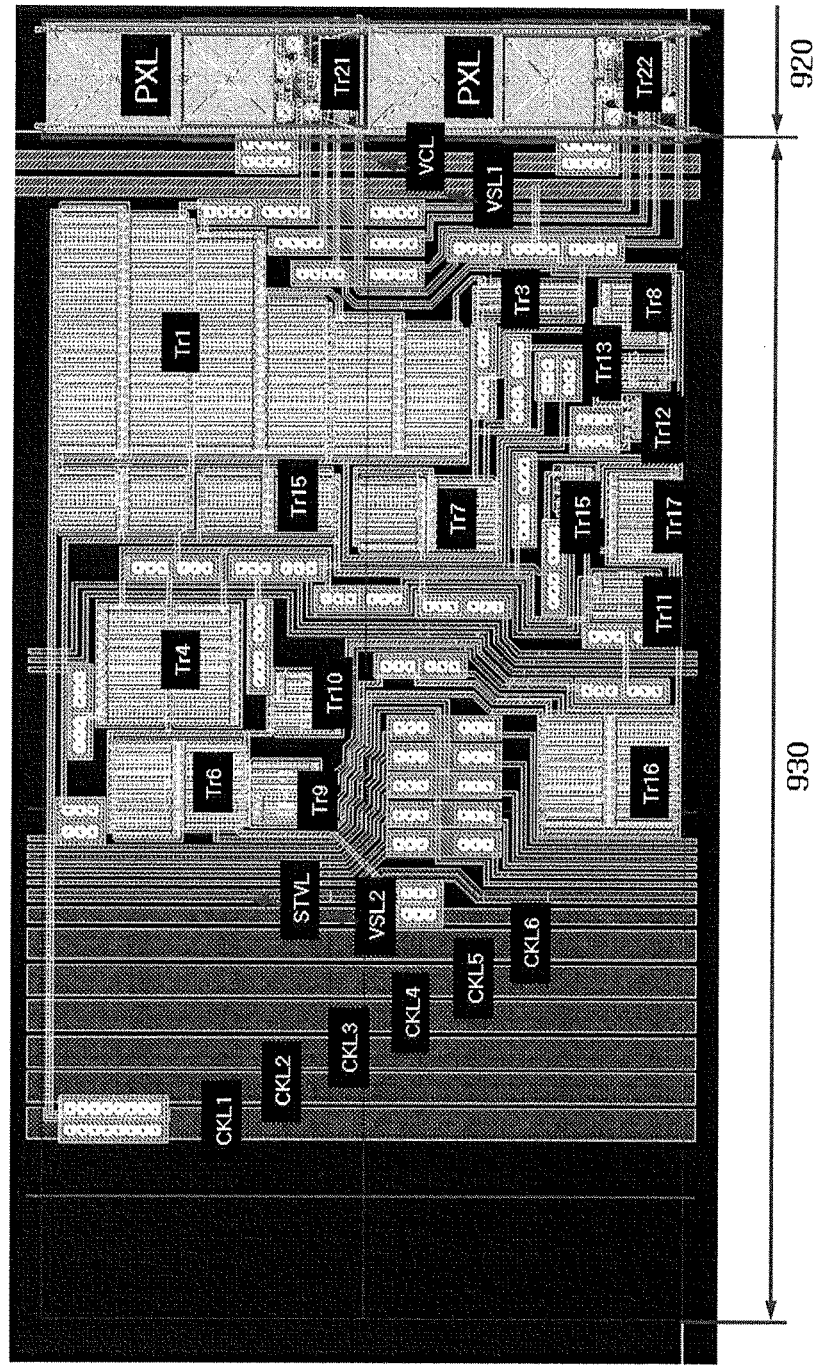
FIG. 11 is a top plan view of a lower panel of an exemplary embodiment of a display panel assembly of an LCD according to the invention.
Figure 12:
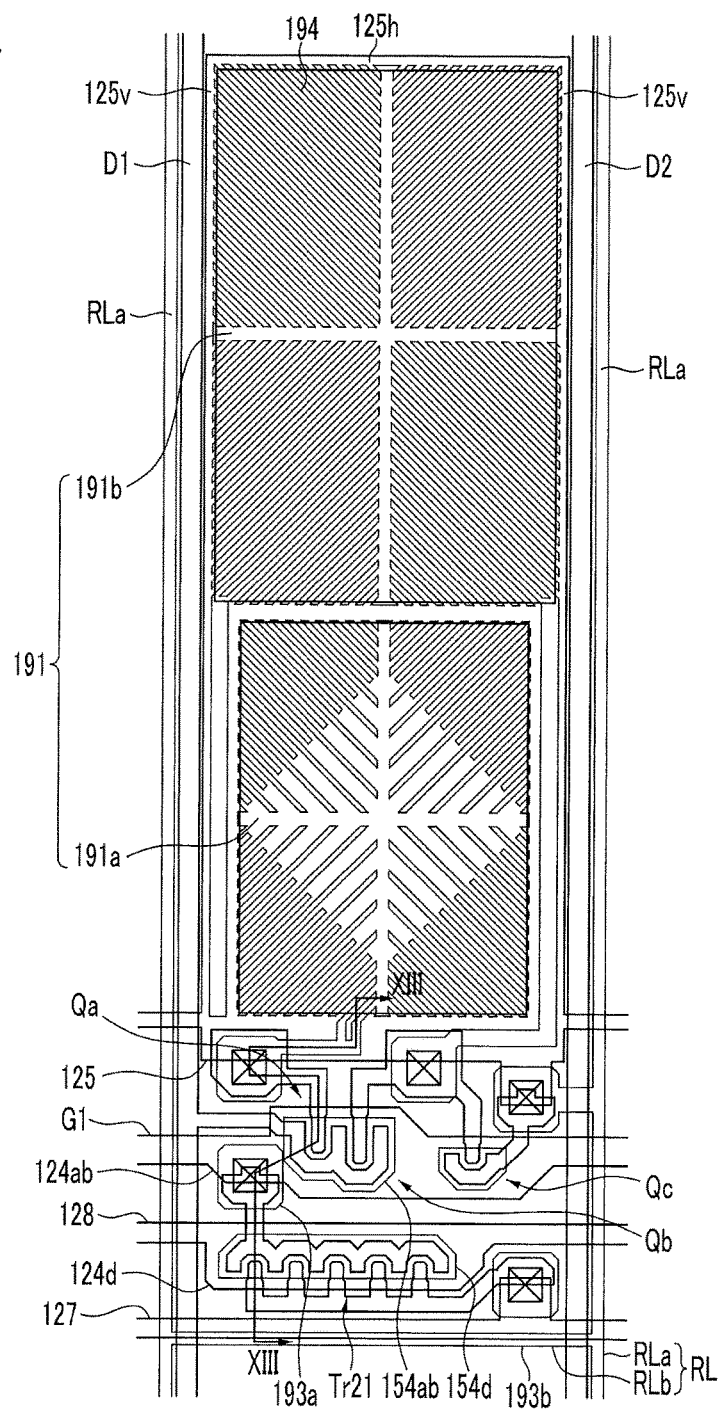
FIG. 12 is a top plan view of an exemplary embodiment of a pixel and a portion of a gate driver disposed under the pixel in the lower panel shown in FIG. 11.
Figure 13:
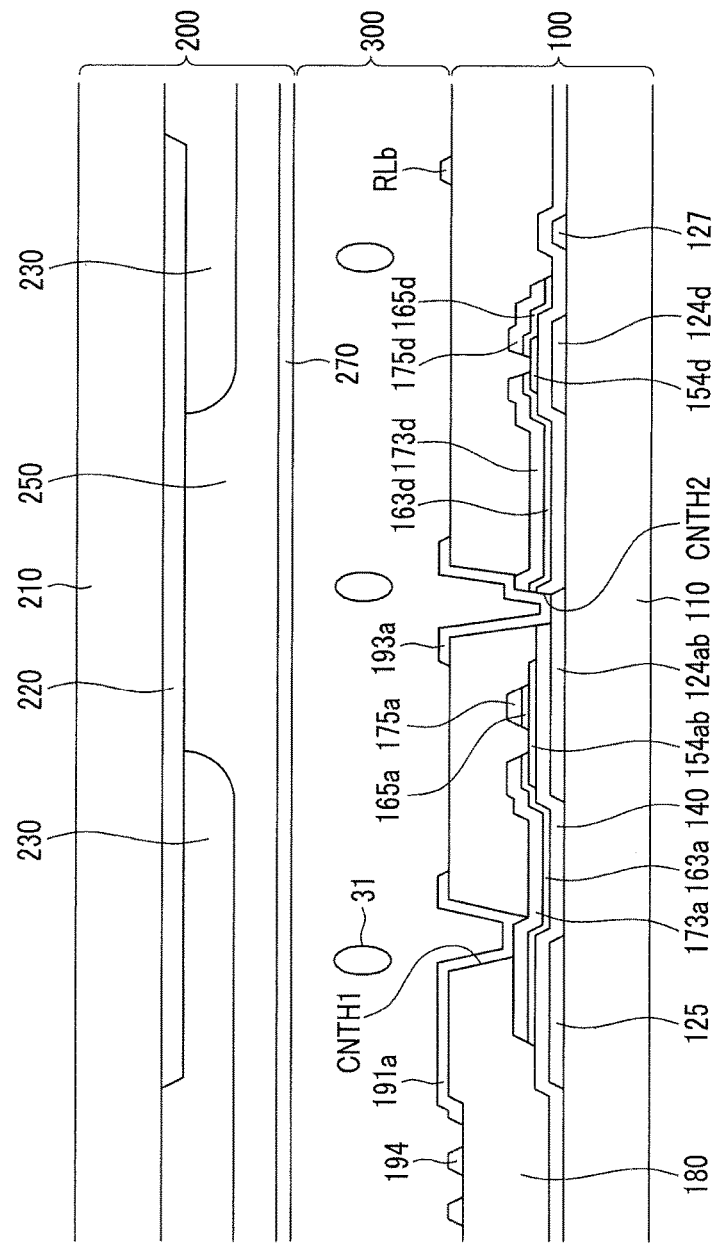
FIG. 13 is a cross-sectional view taken along line XIII-XIII of the lower panel shown in FIG. 12 in a display panel assembly.

FIG. 11 is a top plan view of a lower panel of an exemplary embodiment of a display panel assembly of an LCD according to the invention, FIG. 12 is a top plan view of an exemplary embodiment of a pixel and a portion of a gate driver disposed under the pixel in the lower panel shown in FIG. 11, and FIG. 13 is a cross-sectional view taken along line XIII-XIII of the lower panel shown in FIG. 12 in a display panel assembly.

Referring to FIG. 13, an exemplary embodiment of a display panel assembly of an LCD according to the invention includes a lower panel 100 and an upper panel 200 that is opposite to, e.g., face, each other, a LC layer 300 disposed between the lower and upper panels 100 and 200, and a pair of polarizers (not shown) attached to outer surfaces of the lower and upper panels 100 and 200. The panel assembly includes a pixel including first, second and third switching elements Qa, Qb and Qc, and first and second LC capacitors Clca and Clcb, as shown in FIG. 8. The pixel may include a lower pixel portion disposed in the lower panel 100, an upper pixel portion disposed in the upper panel 200, and a LC portion in the LC layer 300. In FIG. 13, reference numeral 31 denotes liquid crystal molecules.

First, the lower panel 100 will be described in detail.

Referring to FIG. 11, the lower panel 100 includes a gate driver, a plurality of input lines and a plurality of lower pixel portions PXL. The gate driver includes a stage that includes first to seventeenth TFTs Tr1, Tr21, Tr22, Tr3, . . . , Tr17. The plurality of input lines includes a plurality of clock signal lines, e.g., first to sixth clock signal lines CKL1, . . . , CKL6, a plurality of voltage lines, e.g., a first voltage line VSL1 and a second voltage line VSL2, a scanning start signal line STVL, and a common voltage line VCL. The stage of the gate driver shown in FIG. 11 may be substantially the same as the stage SR shown in FIG. 9.

The lower panel 100 is divided into a display area 920 and a peripheral area 930, the lower pixel portions PXL and the second TFTs Tr21 and Tr22 of the stage are disposed in the display area 920, and the other TFTs, e.g., the first and third to seventeenth TFTs Tr1, Tr3, . . . , Tr17, of the stage and the input lines are disposed in the peripheral area 930.

The lower panel 100 may include a lower substrate 110 and a plurality thin films disposed thereon.

Referring to FIG. 11 to FIG. 13, a plurality of gate members is disposed on the lower substrate 110. The gate members include a gate line G1, a first signal line 127, a second signal line 128, control electrodes of the first to third switching elements Qa, Qb and Qc, storage electrodes 125h and 125v, and a storage electrode line 125. The control electrodes include a common control electrode 124ab of the first and second switching elements Qa and Qb, and a control electrode 124d of the second TFT Tr21, for example.

The gate line G1, the first and second signal lines 127 and 128, and the storage electrode line 125 extend substantially in a row direction. The gate line G1 is connected to the common control electrode 124ab of the first and second switching elements Qa and Qb and a gate signal output terminal GSout of the stage. The first signal line 127 may be connected to a first low voltage line VSL1, and the second signal line 128 may be connected to the control electrode 124d of the first second TFT Tr21 and the second signal input terminal IN2 (shown in FIG. 8). The storage electrode line 125 is electrically connected to a horizontal storage electrode 125h and a vertical storage electrode 125v. The storage electrode line 125 is electrically connected to the common voltage line VCL.

The gate members may have a dual-layered structure that includes a first gate conductive layer (not shown) including titanium (Ti) or a titanium (Ti) alloy and a second gate conductive layer (not shown) including copper (Cu) or a copper (Cu) alloy.

A gate insulating layer 140 is disposed on the gate members. The gate insulating layer may include at least one of an organic insulator or an inorganic insulator. The inorganic insulator may include at least one of a silicon nitride ($SiN_x$), a silicon oxide ($SiO_x$), a titania ($TiO_2$), an alumina ($Al_2O_3$), a polysiloxane, phenyl siloxane or a zirconia ($ZrO_2$).

A plurality of semiconductor members, for example, a first semiconductor member 154ab and a second semiconductor member 154d, is disposed on the gate insulating layer 140. The first and second semiconductor members 154ab and 154d may include hydrogenated amorphous silicon, polysilicon, or an oxide semiconductor. The oxide semiconductor may include indium gallium zinc oxide (InGaZnO), zinc tin oxide ("ZTO"), or indium zinc oxide ("IZO").

A plurality of ohmic contacts 163a, 165a, 163d and 165d are disposed on the first and second semiconductor members 154ab and 154d. According to an alternative exemplary embodiment of the invention, the ohmic contacts 163a, 165a, 163b, 165b may be omitted.

A plurality of source-drain electrode members are disposed on the gate insulating layer 140 and the ohmic contacts 163a, 165a, 163d and 165d or the semiconductor members 154ab and 154d. The source-drain electrode members include data lines, e.g., a first data line D1 and a second data line D2, and input terminal and output terminals of the first to third switching elements Qa, Qb and Qc, for example, an output electrode 173a and an input electrode 175a of the first switching element Qa, and an output electrode 173d and an input electrode 175d of the second TFT Tr21. The input electrode 175a of the first switching element Qa is connected to the first data line D1. Channels of the switching elements Qa, Qb and Qc and the first second TFT Tr21 may be formed in the semiconductor members 154ab and 154d between the input electrodes and the output electrodes thereof. The source-drain electrode members may include gallium zinc oxide (GaZnO), aluminum (Al), molybdenum (Mo), titanium (Ti), or manganese (Mn).

A passivation layer 180 is disposed on the source-drain electrode members and the gate insulating layer 140. The passivation layer 180 may include a titania ($TiO_2$), an alumina ($Al_2O_3$), zirconia ($ZrO_2$), a silicon oxide ($SiO_x$) or a silicon nitride ($SiN_x$). The passivation layer 180 and/or the gate insulating layer 140 has a plurality of contact holes, for example, a first contact hole CNTH1 exposing the output electrode 173a of the first switching element Qa and a second contact hole CNTH2 exposing the output electrode 173d of the first second TFT Tr21 and the gate line G1.

A plurality of pixel electrode members is disposed on the passivation layer 180. The pixel electrode members includes a pixel electrode 191, a reference voltage line RL, and a plurality of contact connections 193a and 193b. The pixel electrode members may include a transparent conductive material such as indium tin oxide ("ITO") or IZO, or a reflective metal such as aluminum (Al), silver (Ag), chromium (Cr), and an alloy thereof.

The pixel electrode 191 includes a first subpixel electrode 191a and a second subpixel electrode 191b. The second subpixel electrode 191b may surround a portion of the first subpixel electrode 191a. The first subpixel electrode 191a or the second subpixel electrode 191b may include a plurality of minute branches 194 extending oblique to the gate line G1 or the data lines D1 and D2.

The reference voltage line RL includes a plurality of vertical portions RLa extending substantially parallel to the data lines D1 and D2 and a transverse portion RLb that connects the vertical portions RLa. In such an embodiment, the vertical portions RLa of the reference voltage line RL are connected with the horizontal portion RLb such that signal delay flowing in the reference voltage line RL is substantially reduced.

The pixel electrode members may be connected to the gate members and/or the source-drain electrode members through the contact holes in the passivation layer 180 and/or the gate insulating layer 140. In one exemplary embodiment, for example, the first subpixel electrode 191a is connected to the output electrode 173a of the first switching element Qa through the first contact hole CNTH1, and the contact connection 193a connects the output electrode 173d of the second TFT Tr21 to the gate line G1 through the second contact hole CNTH2. The contact connection 193b the input electrode 175d of the first second TFT Tr21 to the first signal line 127 through a contact hole, the reference voltage line RL is connected to an output electrode of the third switching element Qc through a contact hole, the second subpixel electrode 191b is connected to output electrodes of the second and third switching elements Qb and Qc through a contact hole.

Referring to FIG. 12, the width-to-length ratio of the first second TFT Tr21 may be greater than the width-to-length ratio of the first to third switching elements Qa, Qb and Qc. In an exemplary embodiment, the first second TFT Tr21 may have a shape where a plurality of transistors are connected in parallel, as shown in FIG. 12, such that the width-to-length ratio thereof is substantially increased.

Next, the upper panel 200 will be described in detail.

The upper panel 200 may include an upper substrate 210 and a plurality of thin films thereon.

Referring to FIG. 13, a light blocking member 220, which reduces or blocks light leakage, may be disposed on the upper substrate 210. A plurality of color filters 230 that face the pixel electrode 191 is disposed on the substrate 210 or the light blocking member 220. Each of the color filters 230 may be white or one of primary colors. In an exemplary embodiment, the primary colors may be a set of red, green and blue, for example. In an alternative exemplary embodiment, the primary colors may be a set of cyan, magenta and yellow, for example. According to an alternative embodiment of the invention, the light blocking member 220 or the color filters 230 may be disposed on the lower substrate 110. An overcoat 250 that may include an insulating material is disposed on the color filters 230 and the light blocking member 220. The overcoat 250 effectively prevents the color filters 230 from being exposed, or provides a flat surface. According to another alternative exemplary embodiment of the invention, the overcoat 250 may be omitted. A common electrode 270 is disposed on the overcoat 250.

Alignment layers (not shown) may be disposed on the pixel electrode 191 of the lower panel 100 or the common electrode 270 of the upper panel 200.

Another alternative exemplary embodiment of a display device will be described in detail with reference to FIG. 14.

Figure 14:
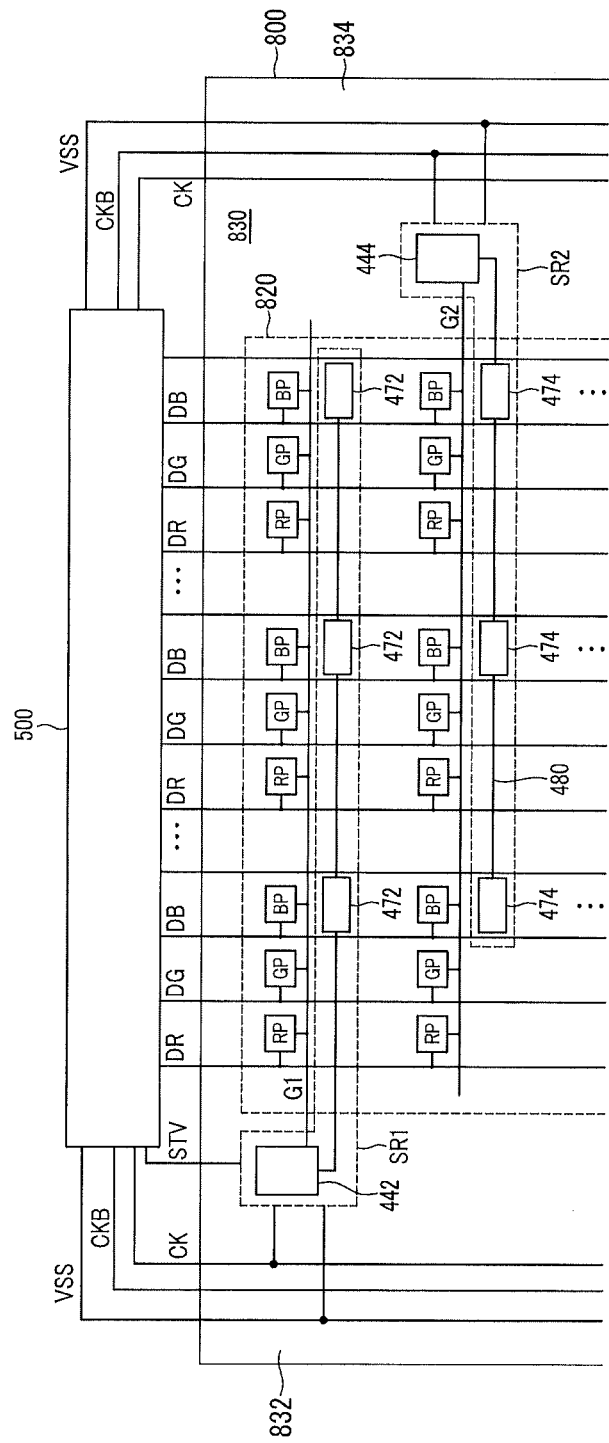
FIG. 14 is a block diagram of another alternative exemplary embodiment of a display device according to the invention.

FIG. 14 is a block diagram of an exemplary embodiment of a display device according to the invention.

Referring to FIG. 14, an exemplary embodiment of a display device according to the invention includes a display panel 800, a gate driver incorporated into the display panel 800, and a data driver 500.

The display panel 800 includes a plurality of pixels RP, GP and BP, a plurality of gate lines G1 and G2, a plurality of data lines DR, DG and DB, and a plurality of input lines VSS, CK, CKB and STV. The display panel 800 may be divided into a display area 820, on which images are displayed, and a peripheral area 830, on which images are not displayed, and the peripheral area 830 includes a left area 832 on the left side of the display area 820 and a right area 834 on the right side of the display area 820.

The pixels RP, GP and BP include groups of red pixels RP, green pixels GP and blue pixels BP, which are arranged substantially in a matrix form including rows and columns. Each group of the red pixels RP, the green pixels GP and the blue pixels BP forms respective columns such that the columns of the red pixels RP, the green pixels GP and the blue pixels BP may be alternately arranged. However, the arrangement of the red pixels RP, the green pixels GP and the blue pixels BP may not be limited thereto.

The columns of the red pixels RP, the green pixels GP and the blue pixels BP are connected to corresponding data lines DR, DG and DB. The rows of pixels RP, GP and BP are connected to corresponding gate lines G1 and G2.

The gate driver includes a plurality of stages, e.g., a first stage SR1 and a second stage SR2, connected to corresponding gate lines, e.g., the first gate line G1 and the second gate line G2, and each of the stages SR1 and SR2 includes a first substage 442 or 444 and a plurality of second substages 472 or 474, which are connected to each other in series.

The first substages 442 and 444 are disposed in the peripheral area 830 and the second substages 472 and 474 are disposed in the display area 820. According to an exemplary embodiment, the first substages 442 of some stages, e.g., the first stage SR1, are disposed in the left area 832 of the peripheral area 830, and the first substages 444 of the other stages, e.g., the second stage SR2, are disposed in the right area 834. In one exemplary embodiment, for example, the first substages 442 of odd-numbered stages SR1 are disposed in the left area 832, and the first substages 444 of even-numbered stages SR2 are disposed in the right area 834.

According to an exemplary embodiment of the invention, the second substages 472 and 474 are disposed adjacent to the blue pixels BP, for example, between the blue pixels BP in a column of the blue pixels BP. In such an embodiment, where the second substages 472 and 474 are disposed adjacent to the blue pixel BP, the transmittance due to the placement of the gate driver in the display area 820 may be compensated, thereby substantially improving image quality. A plurality of conducting lines 480, which is connected to the second substages 472 and 474, may be disposed adjacent to the red pixels RP or the green pixels GP.

According to an exemplary embodiment of the invention, the number of the second substages 472 and 474 may be about 50% or less of the number of the blue pixels BP.

However, the number of the second substages 472 and 474 is not limited thereto. In one exemplary embodiment, for example, the number of the second substages 472 and 474 may be substantially equal to the number of the blue pixels BP.

Other structures and function of the display device in FIG. 14 is substantially the same as those of the exemplary embodiments described above, and thus detailed description thereof is omitted.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a display panel;
   a plurality of data lines on the display panel;
   a plurality of gate lines on the display panel intersecting the plurality of data lines;
   a plurality of pixels defined on the display panel by the plurality of data lines and the plurality of gate lines,
   a gate driver disposed directly with and defined on the display panel and connected to at least two of the pixels;
   wherein the display panel defines a display area, on which an image is displayed, and a non-display area, on which no image is displayed, the display area and the non-display area are located directly on the display panel,
   wherein the pixel comprises:
   a storage capacitor, and
   a transistor including a control terminal connected to one of the gate lines, an input terminal connected to one of the data lines, and an output terminal connected to the storage capacitor,
   wherein the gate driver comprises:
   a first portion disposed in the non-display area; and
   a second portion including at least one transistor electrically connected to the first portion, disposed between the plurality of pixels correspondingly to each of at least two consecutive gate lines of the plurality of gate lines in the display area, and electrically connected to at least one gate line of the at least two consecutive gate lines to change a voltage of the at least one gate line.

2. The display device of claim 1, wherein the second portion of the gate driver extends along one of the plurality of gate lines.

3. The display device of claim 1, wherein the second portion of the gate driver extends along at least two of the plurality of gate lines.

4. The display device of claim 1, wherein each of the plurality of pixels corresponds to one of a plurality of colors, and
   the second portion of the gate driver is disposed between adjacent pixels corresponds to one of a plurality of colors.

5. The display device of claim 1, wherein each of the plurality of pixels comprises:
   a switching unit connected to the gate driver, wherein the switching unit is turned on and off based on the signal from the gate driver or selectively transmits the signal from the gate driver; and
   a display unit connected to the switching unit.

6. The display device of claim 5, wherein the switching unit comprises a thin film transistor including a control terminal, an input terminal and an output terminal, and
   the gate driver is configured to generate a gate signal applied to the control terminal of the thin film transistor through at least one gate line of the plurality of gate lines.

7. The display device of claim 6, wherein the gate driver comprises a plurality of stages connected to each other,
   each of the plurality of stages is connected to a corresponding group of pixels of the plurality of pixels,
   each of the plurality of stages comprises:
   a first substage disposed in the non-display area; and
   a second substage that is connected to the first substage and disposed in the display area.

8. The display device of claim 7, wherein the second substage comprises a plurality of transistors, and
   a number of the plurality of transistors is less than or equal to a number of pixels of the corresponding group of pixels.

9. The display device of claim 7, wherein a stage of the plurality of stages comprises:
   an input unit configured to receive a gate signal of a previous stage;
   a pull up unit configured to output a gate signal thereof;
   a carry signal generating unit configured to output a carry signal to the previous stage or a subsequent stage;
   an inverting unit configured to output a signal having a phase reverse to the gate signal thereof; and
   a pull down unit connected to the input unit, the pull up unit, the carry signal generating unit and the inverting unit, wherein the pull down unit is configured to lower a potential of a node therein,
   wherein each of the input unit, the pull up unit, the carry signal generating unit, the inverting unit and the pull down unit includes a transistor, and
   the second substage comprises transistors of the pull down unit, the pull up unit and the carry signal generating unit.

10. The display device of claim 9, wherein the transistors in the second substage is configured to change the gate signal thereof from a higher voltage to a lower voltage.

11. The display device of claim 1, wherein the second portion of the gate driver comprises at least a portion of an active element.

12. The display device of claim 1, further comprising:
    a light blocking member covering the non-display area.

13. The display device of claim 1, wherein a pixel adjacent to the gate driver is smaller in size than a pixel, which is not adjacent to the gate driver.

14. The display device of claim 1, wherein a signal from the gate driver drives the at least two pixels based on a separate signal from a data driver.

* * * * *